US010337753B2

(12) United States Patent
Brisette et al.

(10) Patent No.: US 10,337,753 B2
(45) Date of Patent: Jul. 2, 2019

(54) ADAPTIVE MODELING METHOD AND SYSTEM FOR MPC-BASED BUILDING ENERGY CONTROL

(71) Applicant: ABB AG, Mannheim (DE)

(72) Inventors: Alex Brisette, Raleigh, NC (US); Joseph Carr, Raleigh, NC (US); Tao Cui, Princeton, NJ (US)

(73) Assignee: ABB AG, Mannheim (DE)

( * ) Notice: Subject to any disclaimer, the term of this patent is extended or adjusted under 35 U.S.C. 154(b) by 0 days.

(21) Appl. No.: 15/389,461

(22) Filed: Dec. 23, 2016

(65) Prior Publication Data

US 2018/0180314 A1 Jun. 28, 2018

(51) Int. Cl.
*G05B 13/04* (2006.01)
*F24F 11/30* (2018.01)
(Continued)

(52) U.S. Cl.
CPC ............ *F24F 11/30* (2018.01); *F24F 11/62* (2018.01); *G05B 13/042* (2013.01); *G05B 13/048* (2013.01); *G05B 23/0281* (2013.01); *G05B 23/0297* (2013.01); *G06F 17/18* (2013.01); *G06F 17/5009* (2013.01); *G06N 7/005* (2013.01); *F24F 11/63* (2018.01); *F24F 11/64* (2018.01); *F24F 2110/10* (2018.01);
(Continued)

(58) Field of Classification Search
CPC ...... G05B 13/048; G05B 17/02; G05B 13/04; G05B 23/0254; G05B 13/042; G05B 19/042; G05B 2219/2614; G05B 2219/32021; G05B 2219/32187

See application file for complete search history.

(56) References Cited

U.S. PATENT DOCUMENTS 6,542,782 B1 * 4/2003 Lu .................. G05B 13/048
700/29
6,598,195 B1 * 7/2003 Adibhatla .......... G05B 23/0275
361/88
(Continued)

OTHER PUBLICATIONS

Samuel F. Fux, et al., "EKF based self-adaptive thermal model for a passive house", Energy and Buildings, vol. 68, part C, Jan. 2014, pp. 811-817.
(Continued)

*Primary Examiner* — Darrin D Dunn
(74) *Attorney, Agent, or Firm* — Leydig, Voit & Mayer, Ltd.

(57) ABSTRACT

A method for controlling a temperature of a building using a building thermal model of the building in a model predictive control (MPC) system includes measuring the temperature and a rate of change of temperature for at least one zone that is included in the building thermal model so as to determine an error from a temperature and rate of change of temperature that is predicted by the MPC system. Possible causes of the error and a probability of each of the possible causes of error occurring are determined. An impact of each of the possible causes is evaluated so as to identify at least one of the possible causes which would reduce the error. The building thermal model is adapted based on the at least one identified possible cause and the temperature of the building is controlled using the adapted building thermal model in an MPC controller.

18 Claims, 4 Drawing Sheets

(51) Int. Cl.
| | |
|---|---|
| *G05B 23/02* | (2006.01) |
| *F24F 11/62* | (2018.01) |
| *G06F 17/18* | (2006.01) |
| *G06F 17/50* | (2006.01) |
| *G06N 7/00* | (2006.01) |
| *F24F 140/40* | (2018.01) |
| *F24F 11/63* | (2018.01) |
| *F24F 120/10* | (2018.01) |
| *F24F 11/64* | (2018.01) |
| *F24F 110/10* | (2018.01) |

(52) U.S. Cl.
CPC ....... *F24F 2120/10* (2018.01); *F24F 2140/40* (2018.01); *G05B 2219/2614* (2013.01); *G05B 2219/2642* (2013.01)

(56) References Cited

U.S. PATENT DOCUMENTS

| | | | | |
|---|---|---|---|---|
| 6,687,637 | B2* | 2/2004 | Garabedian | G05B 9/02 342/41 |
| 7,200,524 | B2* | 4/2007 | Kang | G05B 9/02 702/179 |
| 9,696,947 | B1* | 7/2017 | Gil | G06F 3/121 |
| 9,740,181 | B2* | 8/2017 | Holub | G05B 13/048 |
| 2003/0065409 | A1* | 4/2003 | Raeth | G05B 9/02 700/31 |
| 2005/0251364 | A1* | 11/2005 | Kang | G05B 9/02 702/183 |
| 2007/0282777 | A1* | 12/2007 | Guralnik | G05B 23/0254 706/48 |
| 2009/0002148 | A1* | 1/2009 | Horvitz | G06Q 10/047 340/514 |
| 2012/0089554 | A1* | 4/2012 | Claxton | G06N 7/005 706/52 |
| 2012/0101648 | A1* | 4/2012 | Federspiel | G05D 23/1934 700/291 |
| 2013/0297555 | A1* | 11/2013 | Fadell | G05B 15/02 706/52 |
| 2014/0128997 | A1* | 5/2014 | Holub | G05B 13/048 700/30 |
| 2015/0019912 | A1* | 1/2015 | Darling | G06F 11/2257 714/26 |
| 2015/0148919 | A1* | 5/2015 | Watson | G06N 7/005 700/31 |
| 2016/0085248 | A1* | 3/2016 | Gordon | G05D 23/1917 700/276 |
| 2016/0146493 | A1* | 5/2016 | Ettl | G05B 15/02 700/29 |
| 2016/0179599 | A1* | 6/2016 | Deshpande | G06F 11/0745 714/807 |
| 2016/0201934 | A1* | 7/2016 | Hester | F24F 11/30 700/276 |
| 2017/0060664 | A1* | 3/2017 | Shin | G06F 11/076 |
| 2017/0116530 | A1* | 4/2017 | Modarresi | G06N 5/04 |
| 2017/0144505 | A1* | 5/2017 | Markowitz | B60H 1/00885 |
| 2018/0075549 | A1* | 3/2018 | Turney | G06Q 20/145 |
| 2018/0082204 | A1* | 3/2018 | Iwamasa | G06N 99/005 |
| 2018/0090152 | A1* | 3/2018 | Ichimura | G10L 21/0216 |

OTHER PUBLICATIONS

Frauke Oldewurtel, et al., "Use of model predictive control and weather forecasts for energy efficient building climate control", Energy and Buildings, vol. 45, Feb. 2012, pp. 15-27.

J Y M Cheung, et al., Model-based Controllers for BEMS, Industrial Applications of Model Based Predictive Control, IEE Colloquium on Industrial Applications of Model Based Predictive Control, Nov. 21, 1991, pp. 2/1-2/6.

Yudong Ma, et al., "Predictive Control for Energy Efficient Buildings with Thermal Storage", Modeling, Simulation, and Experiments, IEEE Control Systems Magazine, Feb. 2012, pp. 44-64.

* cited by examiner

ADAPTIVE MODELING METHOD AND SYSTEM FOR MPC-BASED BUILDING ENERGY CONTROL

FIELD

The present invention relates to an adaptive modeling method and system for use in building energy control, and more particularly relates to an improvement in model predictive control (MPC) for building energy control.

BACKGROUND

MPC is a control method which has been used in the chemical industry and, more recently, for load balancing and building energy management. The method uses real-time measurements, forecasted conditions and a model of a process. For a building energy management model, factors such as forecasted weather and past usage over time have been used as discussed in Oldewurtel, F., et al., "Use of model predictive control and weather forecasts for energy efficient building climate control," Energy and Buildings, 45, 15-27 (2012) and in Cheung, J. Y. M., et al., "Model-based controllers for BEMS," Industrial Applications of Model Based Predictive Control, IEE Colloquium, pp. 2/1, 2/6, Nov. 21, 1991 to predict future usage over a predefined time horizon in order to minimize energy usage, energy cost or peak energy consumption.

FIG. 1 shows a block diagram of an MPC system for building energy management. The system includes a fixed thermal model of the building and a controller. Based on the thermal model of the building, present temperature measurements and weather forecasts, the controller optimizes the building thermal performance over a fixed time interval that extends into the future. This optimization is achieved by proposing a large number of possible room temperature setpoints over the time horizon, then analyzing the resulting energy and temperature performance of the building based on the proposed setpoints, thermal model, and weather forecasts. Once this process is complete, the room temperature setpoints that minimize energy usage, cost or peak energy consumption over the interval are selected. The setpoints for the present time interval are implemented while the future setpoints are discarded, and in the next interval, the process is repeated with updated measurements.

Sophisticated models are available for modeling HVAC systems and thermal performance of buildings, but these are often too computationally intense for use in MPC where a large number of simulations must be performed in a short period of time. One commonly used model represents the building as an electrical circuit, for example where insulation between spaces like windows and walls act as thermal resistors, slowing down the flow of thermal energy between two spaces with different temperatures, and the air and objects in a room act as thermal capacitors, storing thermal energy and slowing down how quickly power raises the temperature of the room. In this model, temperature acts like voltage present at nodes within the system while current represents thermal energy flowing between nodes. Some nodes may operate at fixed temperatures, such as the measured outdoor temperature, while current sources may represent constant sources of thermal energy such as an electric heater.

FIG. 2 shows this thermal model. The current source, $P_{SOURCE}$, represents the objects and people in the room that produce thermal power. This can include the HVAC system which regulates temperature in the room, a small space heater, human bodies, and electrical equipment like computers or refrigerators. The capacitor, $C_{ROOM}$, represents the heat capacity of the room. The air has a capacity to store heat power which changes based on humidity and total air volume, while objects in the room like furniture are also capable of storing heat power. The rate of change of temperature for a given input of thermal energy depends on the heat capacity of the room. The resistor, $R_{INSULATION}$, represents the insulation between the room and outdoor space. The room may be connected to multiple other spaces and so may have multiple insulation resistors connecting it to each space. The value of this insulation depends on the material and thickness of the barriers between the room and the space. There may be multiple different barriers, such as a window within a wall. In this case each has a different insulation value and the equivalent insulation resistance between the spaces is an aggregate of the insulation resistances of these various barriers. Finally, the voltage source represents a fixed temperature. The outdoor temperature is dependent on its own set of complex factors, but it is measured directly and may be represented with a fixed parameter in this simulation. It changes slowly enough that it may be considered constant between measurement intervals.

The various components of this model change at various rates, resulting in significant error between the model's estimates of temperature and the actual temperature experienced in the building. Fux, S. F., et al., "EKF based self-adaptive thermal model for a passive house," Energy and Buildings, 68, 811-817 (2014) and Ma, Yudong, et al., "Predictive Control for Energy Efficient Buildings with Thermal Storage," IEEE Control Systems Magazine, 44-64, February 2012 both give methods of estimating this error. In the article by Fux et al., the expert engineer reviews the data and finds that there is significant error between the measured and estimated temperatures during scheduled meetings in the room. This error arises from adding several more heat energy sources, namely the people attending the meeting. This error is corrected manually, with a hard-coded script that adjusts the model during the scheduled meetings to account for the larger number of people in the room. This manual tweaking of the model represents one method of accounting for the errors that arise as the building changes. The weaknesses of this method are that it requires significant engineering investment from an expert and that the adjusted model immediately begins to become obsolete as soon as the expert leaves. Any changes in the occupant behavior, HVAC controls, or to the building structure will not be accounted for in the manually tuned model.

A second method to account for this error is presented in the article by Ma et al., where a Kalman filter is used to analyze data from a sample period and estimate the heat energy disturbance input. This estimated disturbance input is then included in the model, improving performance. In the article, the disturbance came when the occupants opened doors and windows, reducing the insulation between the interior rooms and the outdoors, but this method is able to provide a corrected disturbance input without needing to identify the source of the disturbance. This is an improvement over the first method in that it eliminates the need for an expert to review the data as well as speeding up the analysis, but the model still becomes obsolete as soon as circumstances change. It may be possible to automate this estimation, but the author does not provide a method for this.

SUMMARY

In an embodiment, the present invention provides a method for controlling a temperature of a building using a building thermal model of the building in a model predictive control (MPC) system. The temperature and a rate of change of temperature for at least one zone that is included in the building thermal model are measured so as to determine an error from a temperature and rate of change of temperature that is predicted by the MPC system. Possible causes of the error and a probability of each of the possible causes of error occurring are determined. An impact of each of the possible causes is evaluated so as to identify at least one of the possible causes which would reduce the error. The building thermal model is adapted based on the at least one identified possible cause and the temperature of the building is controlled using the adapted building thermal model in an MPC controller.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

According to an embodiment, the present invention provides a third method of estimating the changes in the model. It uses probabilistic inference to encode expert knowledge about the system during the period when the model is being developed, then uses ongoing measurements to check to see when the model has become inaccurate. Probable causes for the inaccuracy are considered, then the probable cause which best matches the error in the observed and estimated temperature is selected as the actual cause for the error. The model is then updated to reflect this cause. For example, the system may conclude that the temperature is higher than expected because several more people have entered the room. The model would be updated to reflect this new occupancy count, and that updated model would be used in the main MPC algorithm to estimate future building performance The inventors have the discovered that, despite the known MPC approach for building energy management being a powerful tool for optimizing energy performance of buildings, the known MPC approach suffers from a deficiency because the thermal model of the building is fixed and does not adapt to changes in the thermal properties of a building, such as actual occupancy and other unexpected heat sources or sinks. Unmodeled effects such as these cause deviations in the optimization results, potentially leading to significant wasted energy or occupant discomfort. According to an embodiment, the present invention provides an adaptive modeling method and MPC controller that adapts the thermal model of the building to detected changes in the thermal properties of each building room/zone. This method uses temperature measurements to determine when the model is not accurate and uses a probabilistic inference methodology to determine the cause of the inaccuracy.

The first step of this adaptive approach is to determine that the model is not accurate. This is accomplished by measuring the temperature as well as the rate of change of temperature in the zones being modeled. The rate of change of temperature is directly related to the heat energy flows within the zone, so it is a useful measurement to determine the nature of the inaccuracy in the model.

Figure 1:
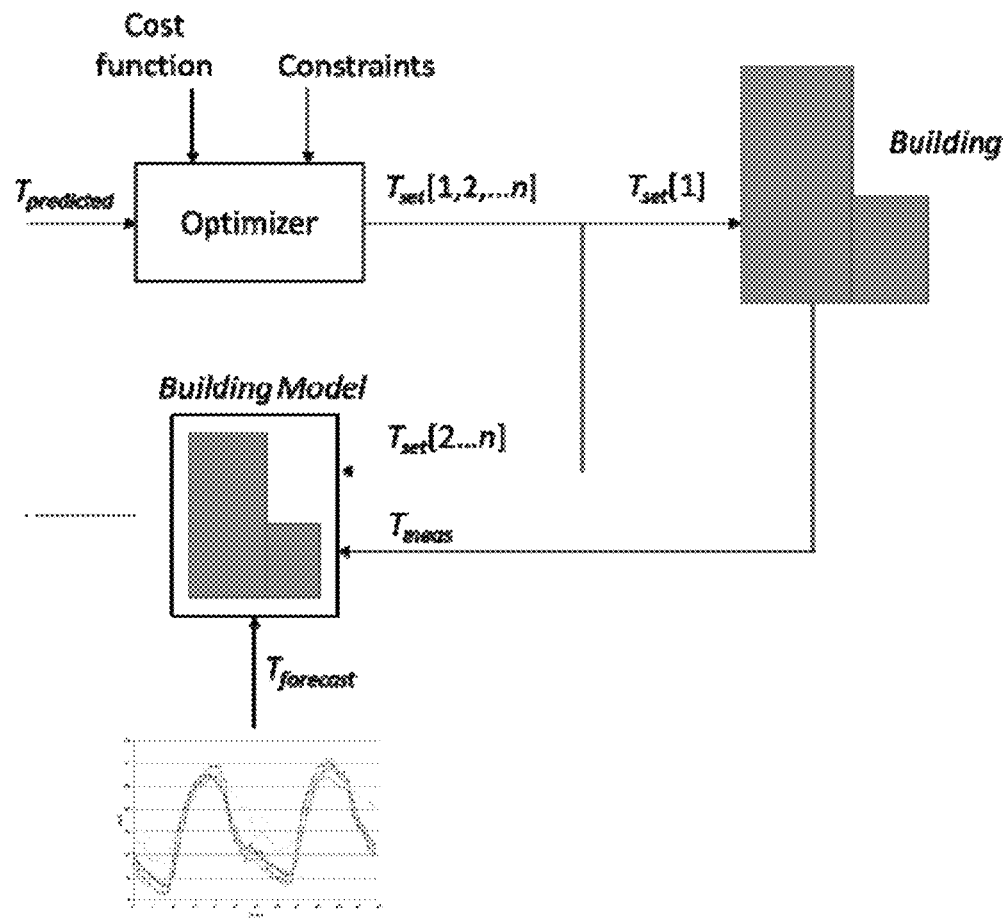
FIG. 1 shows a conventional MPC system for building energy management.
Figure 2:
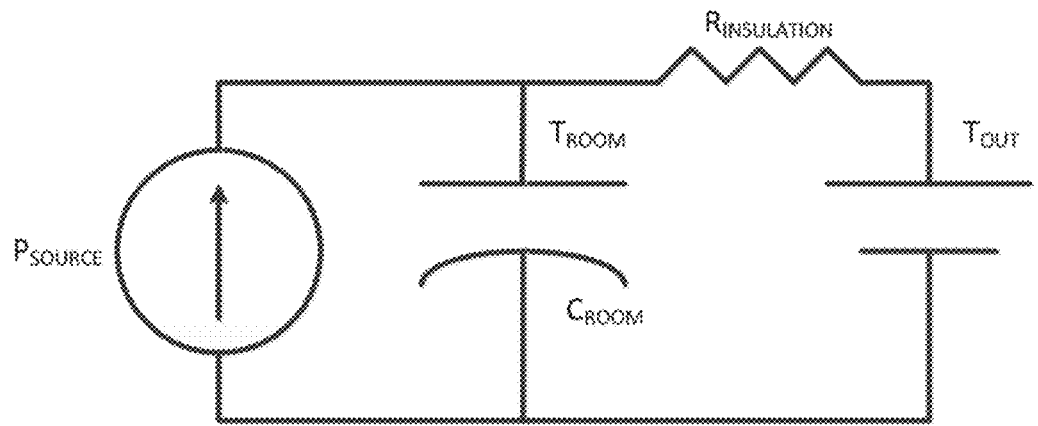
FIG. 2 shows a simplified electrical model used by MPC to model the thermal performance of a room.

The second step of the adaptive modeling is to collect possible causes for the measured inaccuracy. An examination of the model in FIG. 2 reveals that there are a plethora of possible causes for model inaccuracy. There might be a difference in estimated and actual internal heat sources, such as having more people in the zone than expected, having a larger amount of electrical consumption, and hence waste heat, in the zone, or having shades block radiation warming from the sun. Alternatively, the thermal capacity of the zone may have changed because it has a different humidity than was assumed in the model. A third possible difference is that the insulation between the room and other spaces is different. This could be caused by short term phenomena, such as opening doors or windows, or could be caused by long term deterioration in the insulation of the walls. The temperatures of neighboring zones and the outdoors are directly measured, so this method will presume that those values are accurate (though there is a small chance that the temperature sensors are not functioning properly).

The probabilities of various causes for inaccuracies are assigned by the expert when the model is first formed. For example, the probability that a zone has zero occupants may be assigned a value of 15%, of having one, two, or three occupants at 25% each, of having four or five occupants at 5% each, and a negligible chance of having six or more occupants. The waste energy of electrical equipment is divided into several bins, such as between 0 and 200 Watts, 200 and 400 Watts, and 400+ Watts, and a probability is assigned to each bin. If the bin is selected, the equipment is assumed to produce a user specified waste heat for that bin. Other possible changes, such as having shades open or closed, a window open or closed, or a door open or closed, are assigned a probability for each state. If something is not possible, such as the window not being able to be opened, then the probability of it being open is zero. The expert can also assign probabilities to deterioration of insulation or to failure of sensors. These failures could also be graded: there could be one probability for a 5% deterioration of insulation and a second probability for a 10% deterioration of insulation.

These probabilities need not be fixed. They can change based on changing conditions within the building. For example, the probability that there are zero occupants might be 95% overnight, with just a 5% chance of having one occupant and a negligible chance of having more than one occupant. Windows may be more likely to be opened on mild days and have a negligible chance of being opened on exceptionally hot or cold days. The probability of deterioration of the insulation may be negligible within the first 5 years of the building's lifespan, with an increasing probability of deterioration as the building gets older.

Sensor data can be used to get a more precise fix on the probabilities of various parameters. An occupancy sensor may indicate that a room is definitely unoccupied or that it has at least one person. A $CO_2$ sensor or camera may be able to provide a more precise occupant count. Power sensors can determine precisely how much electrical load is being consumed, and in some cases may even be able to determine which equipment is operating. This can be used to differentiate between a heater, which converts most of its electrical power to heat, and a computer which has a lower proportion of losses. Security sensors may be able to determine precisely which windows are open, and a building automation system may contain information about whether shades are drawn or open. This sensor data is used to constrict or even fix the probabilities of various causes of model inaccuracy.

Once the possible causes for error have been identified, the method collects all possible sources that are considered likely. That is, a minimum threshold of probability is assigned and all causes with a probability higher than this threshold are considered. The model is then run with each probable cause, as well as combinations of probable causes, and the temperature and rate of change of temperature is estimated for each of the probable causes and combinations of probable causes. The cause or set of causes which has a temperature and rate of change of temperature that most closely matches the measured temperature and rate of change of temperature is selected to be true, and those causes are incorporated into the model for future iterations of the main MPC algorithm. In the case where several causes and/or sets of causes provide a good match to the observed behavior, then the cause or set of causes with the highest probability is accepted to be true. If no cause provides a close match to the observed error, the cause which is closest is selected if it provides a better match than the current model. If no cause gives a better match than the current model, then the model is left unchanged.

The probability of two events occurring at the same time can be quite complicated. If they are uncorrelated and last a relatively short period of time, then the probability that they occur at the same time can be found by multiplying the probability of each individual event. Thus, for a room with a 25% probability of three people occupying the room and a 10% probability of the window being open, the probability that both occur would be 2.5% if they were uncorrelated and both had a relatively short duration. If the events are correlated, or they last long enough that they have a greater chance of having overlapping durations, then calculating the probability that both occur at the same time requires expert knowledge. For this reason, the user has the capability of assigning probability to combinations of events as well as to individual events. If this information is not provided, the method presumes that all events are of relatively short duration and are uncorrelated. The probability of two events occurring then is calculated by multiplication.

In the following examples, consider a room that may have between zero and five people in it. There is no sensor data for the room, so the user defines the probability of given events occurring. There is a 25% chance for each of one, two, or three people, a 15% chance of zero people, and a 5% chance each for four or five people. There is a 10% chance that the window is open and a 5% chance that the insulation has deteriorated.

The method starts observing an error between the observed and predicted temperature and rate of change of temperature in the room. It then compiles a list of all events and combination of events which might have caused the error and are likely to occur. The threshold of likeliness is set to 2%. In this case, all of the possible events are plausible. Since no probabilities for combinations of events were given, they are presumed to be of short duration and uncorrelated. Therefore the probability of combinations of events are calculated by multiplication, and it is seen that the probability of all combinations of events is less than 5%. Therefore, no combinations of events are considered. Also, the probability that the room insulation has deteriorated is less than the threshold, so it is also not considered. The method then calculates what the predicted temperature and rate of change of temperature would have been for each event to be considered, and these are compared to the observed temperature and rate of change of temperature. The event which most closely fits the data is selected as the event which caused the error, and the model is updated accordingly.

If there are two events which have results that are close to the data, i.e. are within some user-defined band around the error, then the event which is most likely to have occurred is selected. For instance, consider that the model had previously considered that there were two people in the room. It was found that opening the window produces a result with an error of only 3% as to why the room was cooler than expected, but the possibility that one person had left the room has an error of only 6%. The user has specified that all sources of error that get within 10% of the error should be considered, both are considered possible candidates for the modeling error. Since there is a 25% chance that the room has one occupant, but only a 10% chance that the window was opened, then the model accepts the room only having one occupant as the source of the error, even though it is not as good a fit for the data.

Now, consider a case where the user had specified different probabilities for different times. For instance, the chance of insulation deterioration might increase to 5% after three years and to 15% after ten years. This would mean that the method would begin to consider the possibility of insulation deterioration once the building is three years old, and that it would give greater weight to this possibility, selecting it over an open window if both give close results, after ten years.

Next, consider the case when events are correlated. The room likely gets stuffy with three or more people in it, so the chance that the room has a large number of occupants and the window is open is larger than if the two events were uncorrelated. The user therefore specifies a probability of 15% to the window being open and there being three people in the room, and specifies a probability of 5% for the room having four or five people in it and the window being open. Now all of these possibilities are considered when determining the cause of modeling errors.

If sensor inputs are available, then they can be used to modify the probabilities of various events. For instance, a motion sensor might indicate that there are currently no people in the room. Therefore the only remaining explanations for modeling errors are that the window was opened and left open or that there is an insulation deterioration. If both provide good results, the model considers the window being left open as more likely so it is selected. However, if the window does not give a good explanation for the error, but the insulation deterioration does fall within the threshold, then insulation deterioration is accepted as an error in the model and the model is updated accordingly. If neither fits the data, but the insulation deterioration gets a closer match to the observed data, then it is selected as the model error. If, however, the error was that the room got hotter, and both an open window and an insulation deterioration indicate that the room should get cooler, then all causes are rejected and the model is unchanged.

Sensor inputs need not be taken as definitive. For instance, a $CO_2$ sensor might indicate that there are most likely two people in the room. However, due to uncertainties in the sensor measurement and in the calculation method, there is only an 80% confidence in the results. There is a 10% chance that there are three people in the room and a 10% chance that there is only one person in the room. This still improves the method, enabling it to eliminate the possibilities of zero, four, or five people in the room, and also raises the probability of two people in the room and the window being open to a high enough level that it is now considered as a possible cause for the error.

Figure 3:
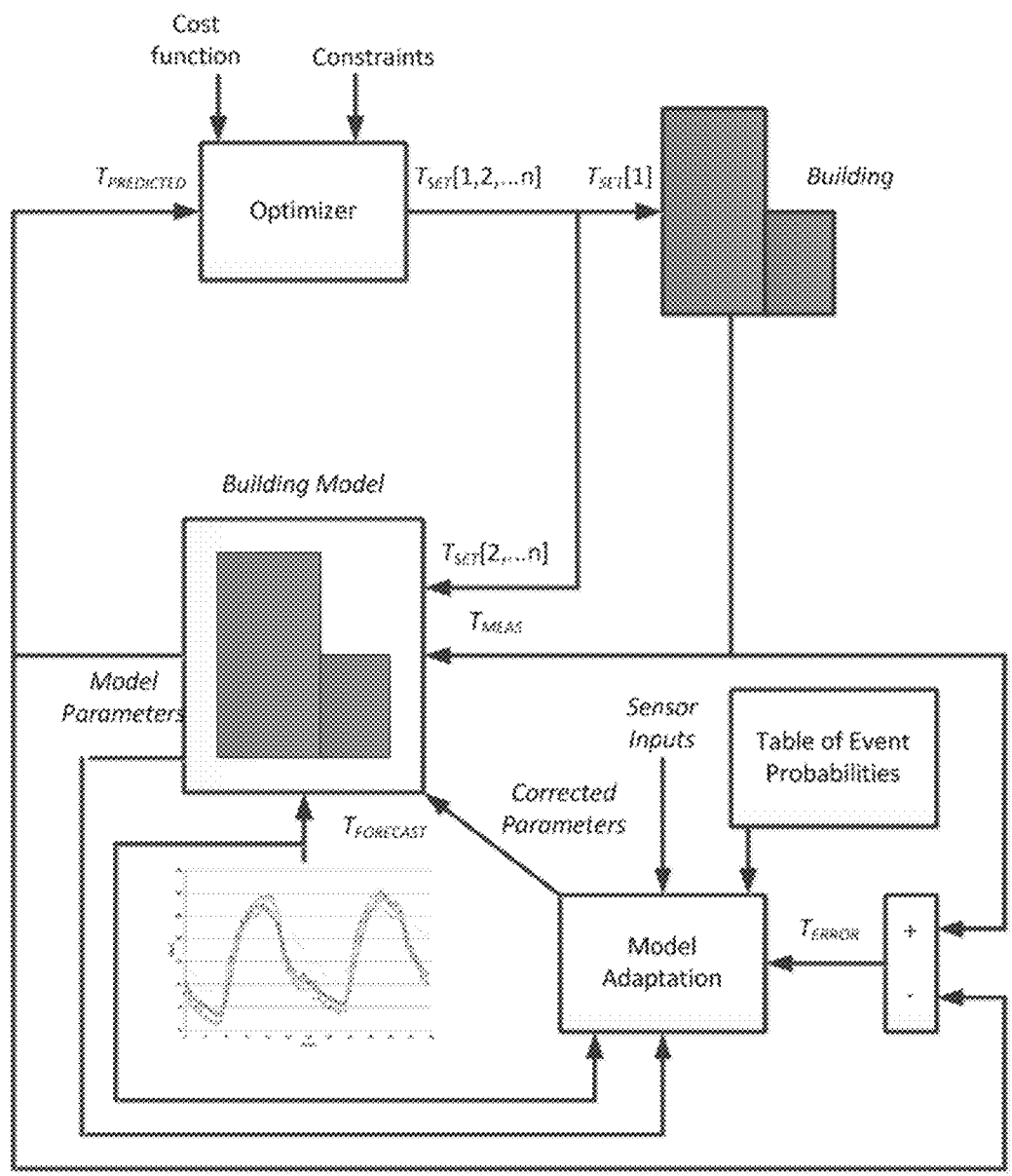
FIG. 3 shows an MPC system according to an embodiment of the present invention.

FIG. 3 schematically shows an MPC system according to an embodiment of the present invention as a block diagram. The MPC system includes sensors and temperature controllers which are preferably disposed inside the building, as well as an MPC controller. The MPC controller is a computer component consisting of one or more computational processors with access to memory. The memory stores a building thermal model, preferably broken up into zones of the building, which models the components of the building as described in FIG. 2. The MPC controller receives a plurality of inputs including a current setpoint temperature, a temperature of the building as measured by at least one temperature sensor in the building and a forecast of local temperatures over a predefined time horizon, for example, from a weather service. Taking into account a cost function, such as the cost of heating at certain times, and other constraints, for example, as optionally defined by the user or by technological limitations, the MPC controller sets the temperature controls of the building for a current time interval in an optimum way with regard to usage and/or costs for the entire time horizon. The cost function and constraints are stored in a memory device that is part of or accessible to the MPC controller.

The MPC controller is modified in this invention to include a model adaptation block. This includes a measurement to determine if the predicted temperature and rate of change of temperature are excessively in error compared to the actual temperature and rate of change of temperature. This indicates an error in the model. The model adaptation block takes this error input as well as inputs from a table of probable causes of error, the forecast, the measured temperatures, and possibly sensor inputs.

Preferably, the MPC controller receives the inputs continuously or periodically and sets the temperature control continuously or for a plurality of time intervals within the entire time horizon.

Preferably, the building thermal model is divided into a plurality of zones A, B . . . n. For example, the zones can correspond to rooms, floors or sections of the building. Walls or other building components adjoining zones can be included at least partially in each of the zones they touch.

Figure 4:
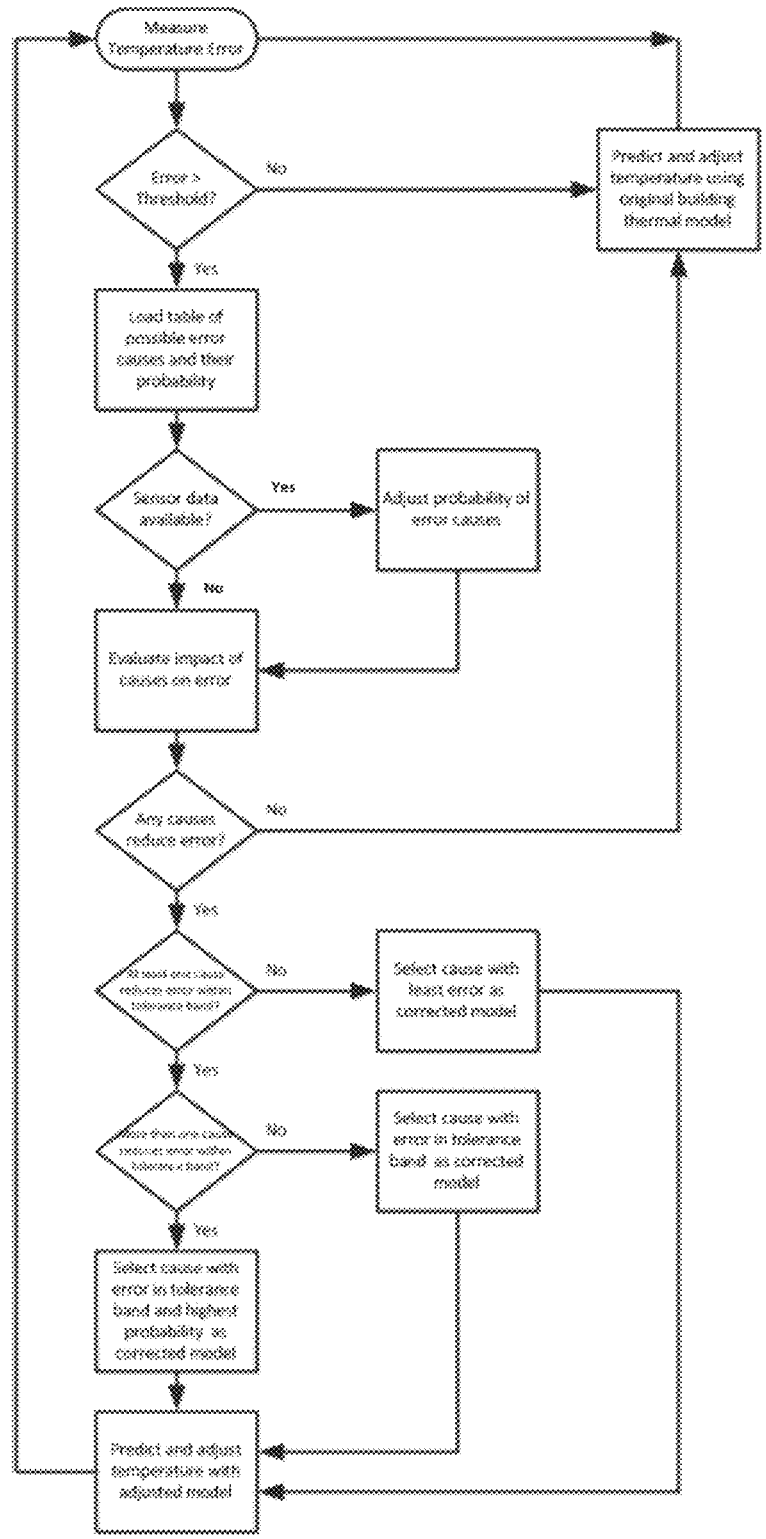
FIG. 4 is a flow chart illustrating the steps of an adaptive modeling method according to an embodiment of the invention.

FIG. 4 shows a flow chart of the steps of an adaptive modeling method according to an embodiment of the invention. In a first step, the error between the predicted and measured temperature and rate of change of temperature in each zone is measured. If this error exceeds a threshold, the method assembles a table of possible causes and their initial probability. If sensor data is available, this data can be used to modify the probability of the various causes of error. This sensor data can include exterior weather data and time data, so this step includes updating probabilities based on exterior weather conditions or on the passage of time, as well as modifying probabilities based on direct measurements of the possible causes. A direct measurement might include, for example, an occupancy sensor. Once the possible causes are collected and their probabilities are determined, the method considers all possible causes whose probability exceeds a predefined threshold and determines what the error would have been if they had been included. If none of them reduce the error, the original model is used. If none reduce the model to within a threshold of error, the cause with the least error is assumed to be true and the model is adjusted accordingly. If one cause reduces error within the threshold, then it is accepted to be true and the model is adjusted accordingly. If more than one cause reduces error within the threshold, the cause with the highest probability is accepted as true and the model is adjusted accordingly. The adjusted model is then used for future iterations of the MPC algorithm.

Accordingly, embodiments of the present invention effect an improvement in MPC control particularly for the application of controlling building temperature. Furthermore, embodiments of the present invention improve the functioning of the MPC controller and the MPC control system themselves by providing a model which is more accurate, and therefore does not waste computational or other resources by using inaccurate, fixed models. Moreover, the adaptation of particular zones having unexpected heat sources or heat sinks in real-time results in faster and more accurate control in those particular zones.

According to an embodiment, one particular application of the adaptive modeling method of the present invention is providing building energy control, specifically for controlling internal building temperatures to minimize total energy usage or cost.

One advantage of embodiments of the present invention is the ability to adapt the building thermal model to changing conditions in real time. By periodically updating the building thermal model, the MPC controller may more effectively guarantee optimal building energy performance, preventing unpredicted thermal effects that degrade the optimization.

According to an embodiment, the method may be employed for building thermal self-modeling, allowing the MPC controller to operate as a fully autonomous, turn-key system.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for controlling a temperature of a building using a building thermal model of the building in a model predictive control (MPC) system, the method comprising:

measuring the temperature and a rate of change of temperature for at least one zone that is included in the building thermal model so as to determine an error from a temperature and rate of change of temperature that is predicted by the MPC system;

determining possible causes of the error and a probability of each of the possible causes of error occurring;

evaluating an impact of each of the possible causes so as to identify at least one of the possible causes which would reduce the error;

adapting the building thermal model based on the at least one identified possible cause;

controlling the temperature of the building using the adapted building thermal model in an MPC controller; and determining a correlation between at least two of the possible causes occurring at a same time and determining a probability of the at least two of the possible causes occurring by multiplying the probabilities of each of the at least two possible causes occurring individually, wherein the probability of the at least two of the possible causes occurring is used in evaluating the impact so as to determine whether the at least two of the possible causes occurring at the same time is the most likely cause of the error.

2. A model predictive control (MPC) system with an adaptive building thermal model for controlling a temperature of a building, the MPC system comprising one or more computational processors, which alone or in combination, are configured to:

determine an error between a measured temperature and rate of change of the temperature and a temperature and rate of change of temperature that is predicted by the MPC system for at least one zone of the building;

access a memory storage containing a table of possible causes of the error and a probability of each of the possible causes of error occurring;

evaluate an impact of each of the possible causes so as to identify at least one of the possible causes which would reduce the error;

adapt the building thermal model based on the at least one identified possible cause; and control the temperature of the building using the adapted building thermal model, wherein the MPC system is configured to determine a correlation between at least two of the possible causes occurring at a same time and a probability of the at least two of the possible causes occurring by multiplying the probabilities of each of the at least two possible causes occurring individually, and wherein the MPC system is configured to use the probability of the at least two of the possible causes occurring in evaluating the impact so as to determine whether the at least two of the possible causes occurring at the same time is the most likely cause of the error.

3. The method according to claim 1, further comprising determining whether the error exceeds a predefined threshold.

4. The method according to claim 1, further comprising adjusting the probability of at least one of the possible causes of error occurring using sensor data from at least one sensor.

5. The method according to claim 4, wherein the at least one sensor includes a motion sensor, a $CO_2$ sensor or a camera disposed in the at least one zone and the sensor data indicates an occupancy level which accounts for at least one of the possible causes.

6. The method according to claim 4, wherein the at least one sensor includes a security sensor disposed in the at least one zone and the sensor data indicates the probability that a window is open which accounts for at least one of the possible causes.

7. The method according to claim 4, wherein the adjusting the probability of the at least one of the possible causes of error occurring takes into account a probability of the failure of the at least one sensor.

8. The method according to claim 1, wherein each of the possible causes of error which would reduce the error within a predetermined tolerance band are identified.

9. The method according to claim 8, wherein the possible cause of error having the highest probability of occurring is used to adapt the building thermal model.

10. The method according to claim 1, further comprising adjusting the probability of at least one of the possible causes of error occurring based on at least one of an outdoor temperature, a time of day at which the method is being performed or an age of the building.

11. The MPC system according to claim 2, wherein the MPC system is configured to determine whether the error exceeds a predefined threshold.

12. The MPC system according to claim 2, further comprising at least one sensor, wherein the MPC system is configured to adjust the probability of at least one of the possible causes of error occurring using sensor data from at least one sensor.

13. The MPC system according to claim 12, wherein the at least one sensor includes a motion sensor, a $CO_2$ sensor or a camera disposed in the at least one zone and the sensor data indicates an occupancy level which accounts for at least one of the possible causes.

14. The MPC system according to claim 12, wherein the at least one sensor includes a security sensor disposed in the at least one zone and the sensor data indicates the probability that a window is open which accounts for at least one of the possible causes.

15. The MPC system according to claim 12, wherein the MPC system is configured to adjust the probability of the at least one of the possible causes of error occurring taking into account a probability of the failure of the at least one sensor.

16. The MPC system according to claim 2, wherein the MPC system is configured to identify each of the possible causes of error which would reduce the error within a predetermined tolerance band.

17. The MPC system according to claim 2, wherein the MPC system is configured to use the possible cause of error having the highest probability of occurring to adapt the building thermal model.

18. The MPC system according to claim 2, wherein the MPC system is configured to adjust the probability of at least one of the possible causes of error occurring based on at least one of an outdoor temperature, a time of day or an age of the building.

* * * * *

UNITED STATES PATENT AND TRADEMARK OFFICE
CERTIFICATE OF CORRECTION

| | | |
|---|---|---|
| PATENT NO. | : 10,337,753 B2 | Page 1 of 1 |
| APPLICATION NO. | : 15/389461 | |
| DATED | : July 2, 2019 | |
| INVENTOR(S) | : Alex Brissette, Joseph Carr and Tao Cui | |

It is certified that error appears in the above-identified patent and that said Letters Patent is hereby corrected as shown below:

On the Title Page

The name of the first named inventor reads "Alex Brisette" and should read --Alex Brissette--

Signed and Sealed this
Eighth Day of December, 2020

Andrei Iancu
*Director of the United States Patent and Trademark Office*